United States Patent
Schleicher

(10) Patent No.: US 6,263,482 B1
(45) Date of Patent: Jul. 17, 2001

(54) PROGRAMMABLE LOGIC DEVICE HAVING MACROCELLS WITH SELECTABLE PRODUCT-TERM INVERSION

(75) Inventor: James G. Schleicher, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/237,189

(22) Filed: Jan. 26, 1999

Related U.S. Application Data

(60) Provisional application No. 60/086,403, filed on May 22, 1998.

(51) Int. Cl.[7] .................................................. G06F 17/50
(52) U.S. Cl. ................................ 716/17; 716/16; 326/39; 326/40; 326/41
(58) Field of Search ........................ 716/17, 16; 326/39, 326/40, 41

(56) References Cited

U.S. PATENT DOCUMENTS

| | | | |
|---|---|---|---|
| 4,871,930 | 10/1989 | Wong et al. | 326/39 |
| 4,903,223 | 2/1990 | Norman et al. | 326/39 |
| 4,969,107 | * 11/1990 | Kaplinsky | 326/44 |
| 5,309,046 | * 5/1994 | Steele | 326/39 |
| 5,350,954 | 9/1994 | Patel et al. | 326/39 |
| 5,757,207 | * 5/1998 | Lytle et al. | 326/39 |
| 5,764,078 | * 6/1998 | Agrawal et al. | 326/40 |
| 6,034,540 | * 3/2000 | Mendel | 326/39 |
| 6,049,223 | * 4/2000 | Lytle et al. | 326/40 |
| 6,134,166 | * 10/2000 | Lytle et al. | 365/221 |
| 6,184,710 | * 2/2001 | Mendel | 326/41 |

OTHER PUBLICATIONS

Tirumalai et al, "Minimization Algorithms for Multiple–Valued Programmable Logic Arrays," IEEE, Feb. 1991, pp. 167–177.*

Kozlowski et al, "An Enhanced Algorithm for the Minization of Exclusive–or Sum–of–Products for Incompletely Specified Functions," IEEE, 1995, pp. 244–249.*

"Hybrid FPGA Architecture," by Alireza Kaviani et al., FPGA '96, Monterey, California (1996).

"Altera 1996 Data Book," pp. 157–179, 191–215; and 311–322, Altera Corporation, San Jose, California (1996).

* cited by examiner

Primary Examiner—Matthew Smith
Assistant Examiner—Vuthe Siek
(74) Attorney, Agent, or Firm—Fish & Neave; Robert R. Jackson

(57) ABSTRACT

A programmable logic device is provided that contains macrocells with selectable inversion circuitry. The macrocells may be organized in groups of macrocells called logic array blocks. The logic array blocks may be interconnected by a programmable interconnect array. Each logic array block has an associated logic array block programmable interconnect array for receiving logic signals, for performing logical AND operations on the logic signals, and for providing resulting product-terms to the macrocells. The macrocells receive the product-terms using a number of normal product-term inputs. Each macrocell has shared expander logic for feeding back an inverted version of a given product term as an input to that macrocell. The shared expander logic also allows the given product term to be inverted without being fed back. The inverted version of the product term that is not fed back may be passed to the output of the macrocell. Because feedback is avoided, the delay inherent in inverting the given product term in the feed back path is avoided.

24 Claims, 5 Drawing Sheets

PROGRAMMABLE LOGIC DEVICE HAVING MACROCELLS WITH SELECTABLE PRODUCT-TERM INVERSION

This application claims the benefit of U.S. provisional application No. 60/086,403, filed May 22, 1998.

BACKGROUND OF THE INVENTION

This invention relates to programmable logic devices. More particularly, this invention relates to shared expander logic circuitry in such logic devices with which certain product-term logic signals may be selectively inverted.

Programmable logic devices are integrated circuits that may be programmed by a user to perform various logic functions. Some programmable logic devices use product-term architectures, in which input signals that have been combined using logical AND functions (product-terms) are further combined using logical OR functions (i.e., they are summed). Devices using product-term architectures may be based on programmable logic organized in the form of logic array blocks each of which contains a number of macrocells.

A typical macrocell contains OR logic for summing the product-terms associated with that macrocell. Each macrocell has a predetermined number of normal product-term inputs. For example, each macrocell may have five normal product-term inputs. Each macrocell may also accept a number of product-terms that have been borrowed from neighboring macrocells (sometimes referred to as parallel expanders). This allows macrocells with five normal product-term inputs to implement logic functions involving more than five product-terms.

Another type of expander connection that some macrocells use is the shared expander. Shared expanders are inverted product-terms that may be fed back to the inputs of the macrocells. Macrocells with shared expander logic can perform certain logic functions using fewer product-terms than would otherwise be possible. However, there is a speed penalty associated with conventional shared expander logic circuits, because a delay is incurred when the shared expander signals are fed back as inputs to the macrocells.

It is therefore an object of the present invention to provide arrangements that allow macrocells to handle more product-terms without needing to feed back signals to the inputs of the macrocells and without needing to borrow product-terms from neighboring macrocells.

SUMMARY OF THE INVENTION

These and other objects of the invention are accomplished in accordance with the principles of the present invention by providing programmable logic device macrocells with selective inversion circuitry. The selective inversion circuitry allows product-term signals to be inverted when needed to perform a DeMorgan's transformation on a group of product terms. This approach permits logic functions that would otherwise require more product-terms than can be handled by a single macrocell to be implemented using a single macrocell. The use of conventional shared expander logic, which imposes a speed penalty for product-term inversion, is avoided.

The selective inversion macrocell circuitry of the present invention may be used with any programmable logic device having macrocells and a product-term architecture. A product-term architecture is one in which logic signals that are provided to an array or other such switching network are combined using a logical product (AND) function. The resulting product-terms are supplied to the inputs of various macrocells. Macrocells contain OR logic for logically summing the product-terms. Macrocells also typically include register logic for registering macrocell output signals. Macrocells may contain other suitable macrocell circuitry and may be arranged in logic array blocks if desired. The programmable logic devices of the present invention may be used as part of larger systems.

Further features of the invention and its nature and various advantages will be more apparent from the accompanying drawings and the following detailed description of the preferred embodiments.

DETAILED DESCRIPTION OF THE PREFERRED EMBODIMENTS

Figure 1:
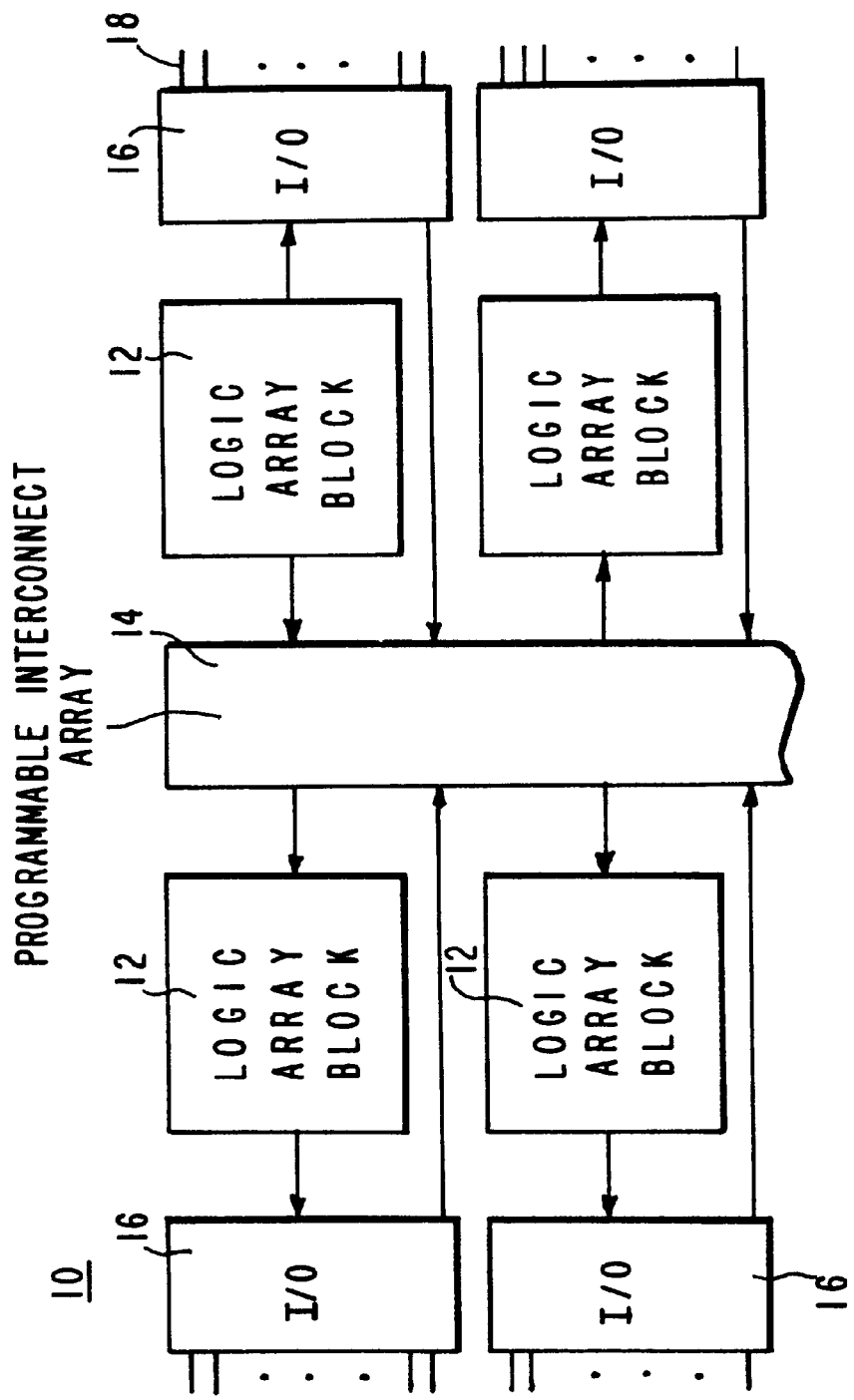
FIG. 1 is a diagram of an illustrative programmable logic device having programmable logic arranged in logic array blocks in accordance with the present invention.

A programmable logic device 10 in accordance with the present invention is shown in FIG. 1. Programmable logic device 10 has a number of logic array blocks 12 arranged in rows and columns. The logic array block arrangement of FIG. 1 is merely illustrative. If desired, the logic of programmable logic device 10 can be arranged in other such suitable groups of logic or may be arranged in an essentially ungrouped configuration.

A programmable interconnect array 14 or other suitable interconnect structure may be used to interconnect logic array blocks 12 and input/output blocks 16. Input/output pins 18 are provided around the periphery of device 10. Input signals from pins 18 may be routed into logic array blocks 12 via input/output blocks 12 and programmable interconnect array 14. Output signals from logic array blocks 12 may be routed onto pins 18 via input/output blocks 16.

Figure 2:
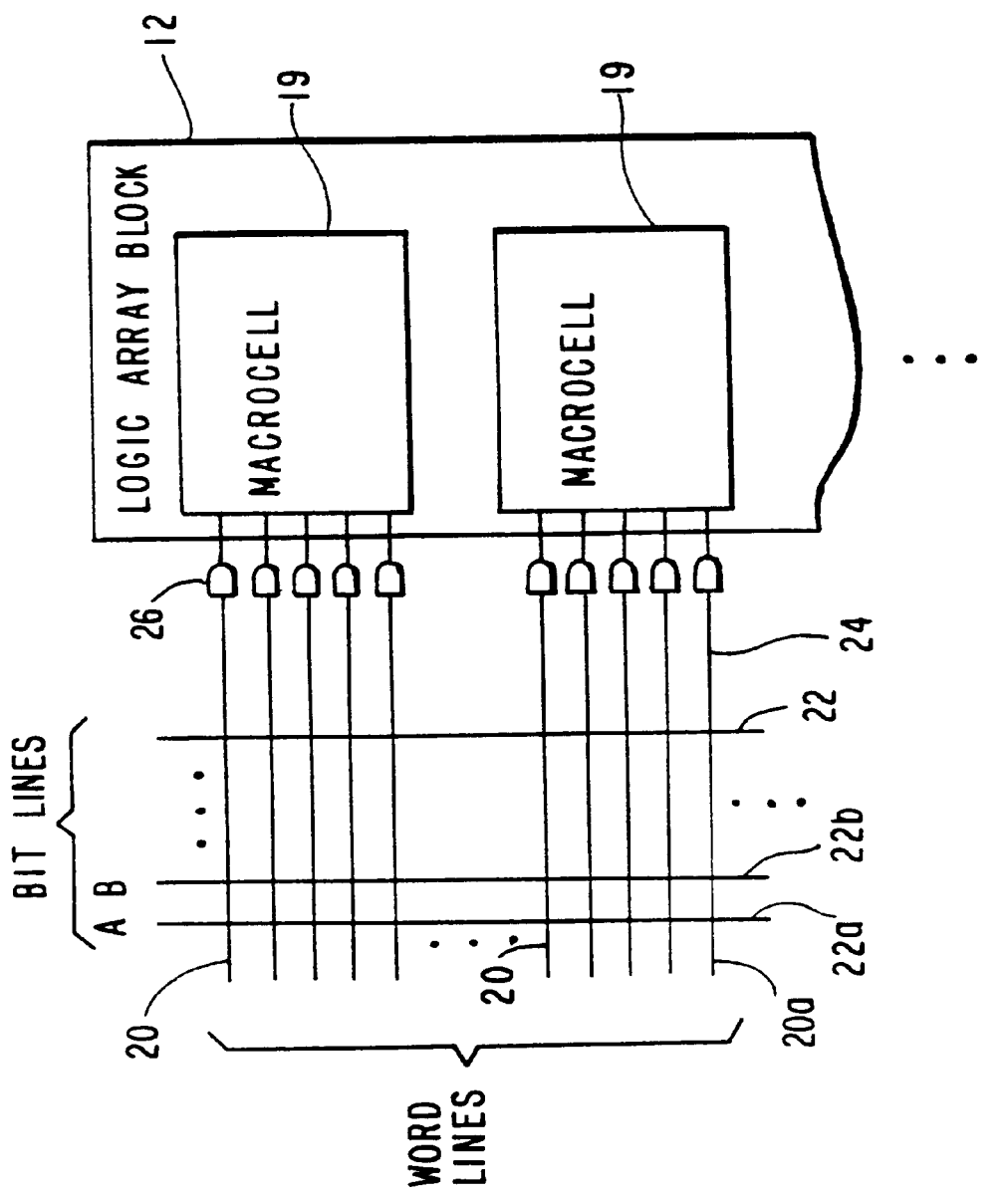
FIG. 2 is a diagram of illustrative logic array block circuitry in accordance with the present invention.

As shown in FIG. 2, each logic array block 12 may contain a number of macrocells 19, each of which receives a number of product-term inputs 20 (sometimes called word lines). Signals are fed to the word lines from bit lines 22. At the intersection of each word line and each bit line is a programmable connection. If device 10 is configured so that a given connection is made, input signals on the associated bit lines are passed to the associated word line. The logic signal at the output 24 of each word line is the logical product of the input signals applied on the bit lines that are connected to that word line. For example, if the logic input signal on bit line 22a is A and the logic input signal on bit line 22b is B, and if programmable connections are made between bit lines 22a and 22b and word line 20a at their intersections, the resulting logical signal on output 24 of word line 20a is A AND B. This functionality is represented by AND gate symbols 26 at the end of each word line. The bit lines 22 and word lines 20 that are associated with a given macrocell are part of a programmable interconnect array that is interconnected with programmable interconnect array 14 of FIG. 1 and that spans each of the macrocells in the logic array block for that macrocell.

Figure 3:
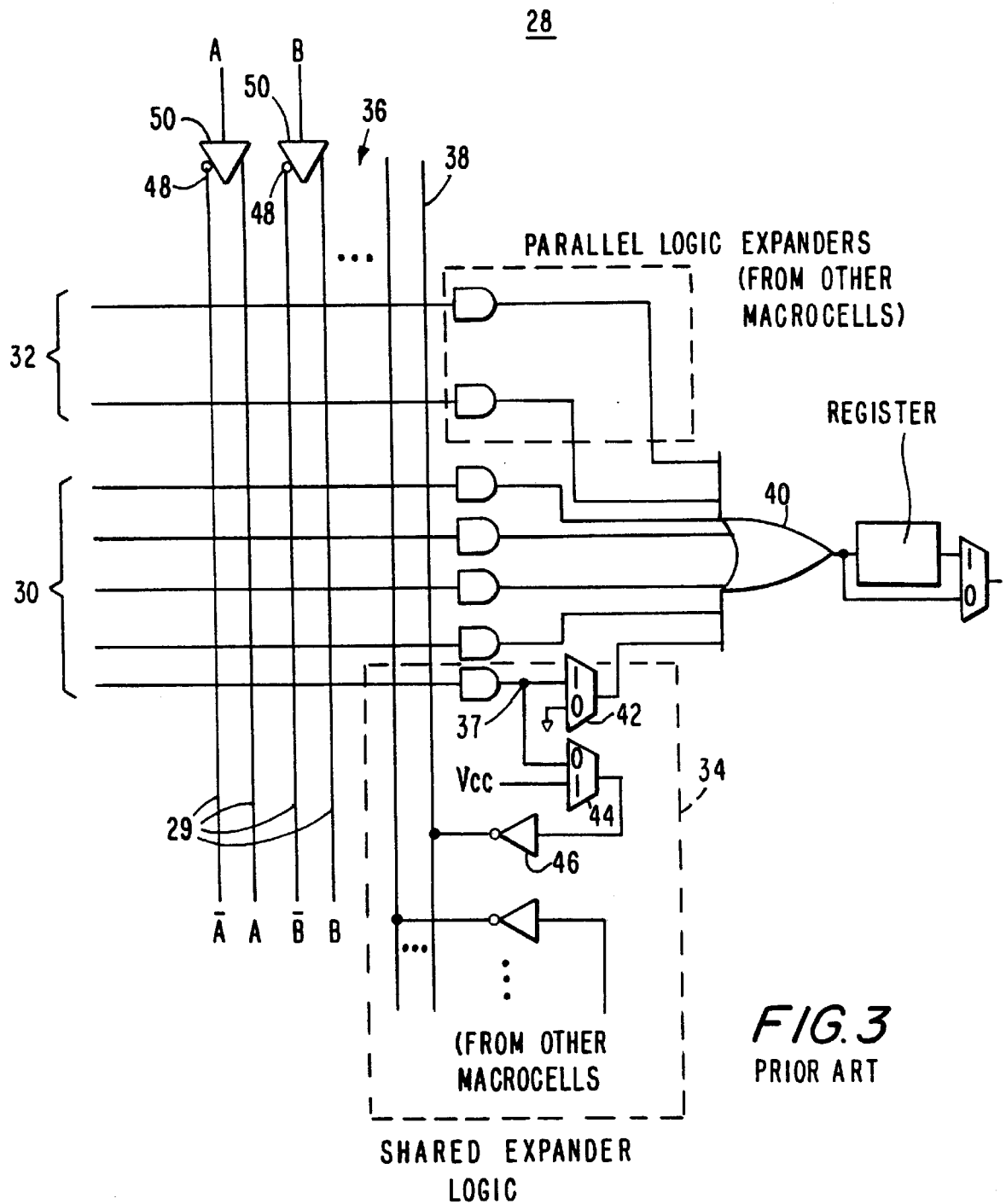
FIG. 3 is a diagram of a conventional macrocell showing the use of parallel expanders and shared expanders.

A conventional macrocell 28 is shown in FIG. 3. The true and complement of logic input signals (A, B, . . . ) for the logic array block associated with macrocell 28 are provided on bit lines 29. Array 36 contains programmable connections at the intersection of bits lines 29 and the horizontal word lines shown in FIG. 3 that allow a logic designer to selectively implement various logic AND functions. For example, array 36 may be configured so that one word line passes the logic signal A (only a single connection is made), another word line passes the logic signal A AND B (also written as A·B), and yet another word line passes the logic signal C AND D. Five of the word line inputs received by macrocell 28 are five normal product-terms 30. Macrocell 28 may also receive a number of word line inputs that are parallel expanders 32. Parallel expanders 32 are product-terms that have been borrowed from neighboring macrocells 28.

Macrocell 28 may use parallel expanders 32 when it is desired to implement a logic function that uses more than five product-terms. For example, consider the logic function given in equation 1.

$$A \cdot B + C + D + E + F + G \quad (1)$$

The logic function of Equation 1 requires six product-terms—one each for the six signals A·B, C, D, E, F, and G. The first five of these signals (A·B, C, D, E, and F) may be handled by the five normal product-terms 30 for macrocell 28. The remaining signal (G) may be handled by routing that signal through a neighboring macrocell and then into macrocell 28 using a parallel expander. Although this arrangement accommodates all six product-terms, two macrocells are required and a delay associated with the use of the parallel expander is incurred.

Another way in which to implement the logic function of equation 1 is by using shared expander logic 34. Shared expander logic 34 may be used to feed back an inverted version of the product-term signal at node 37 into array 36 using line 38. When it is desired to route the signal at node 37 to OR logic 40, multiplexer 42 is configured to pass its "1" input to its output so that the node 37 signal is passed to OR logic 40 and multiplexer 44 is configured to pass its "1" input to its output so that Vcc is inverted by inverter 46 and a ground potential is applied to line 38. When it is desired to route the signal at node 37 to array 36, multiplexer 42 is configured to pass its "0" input to its output so that a ground potential is applied to OR logic 40 and multiplexer 44 is configured to pass its "0" input to its output so that the signal at node 37 is inverted by inverter 46 and the inverted version of the signal at node 37 is fed back to the input of macrocell 28 via line 38.

Shared expander logic 34 may be used to implement the function of equation 1 by performing a DeMorgan's transformation, as shown in equation 2.

$$A \cdot B + SEXP(\overline{C} \cdot \overline{D} \cdot \overline{E} \cdot \overline{F} \cdot \overline{G} + ee) \quad (2)$$

In equation 2, the DeMorgan's boolean identity X+Y=NOT [(NOT X) AND (NOT Y)] has been used to transform the five single product-terms C, D, E, F, and G into a single product-term. The signals C, D, E, F, and G can be inverted by configuring array 36 to select signals from bit line driver inverting outputs such as inverting outputs 48 of bit line drivers 50 when input logic signals are provided to array 36. The overall inversion of the combined product of each of these inverted signals is produced by inverter 46. The notation SEXP indicates that this arrangement involves use of a shared expander. Equation 2 demonstrates that the use of the shared expander feature allows a single macrocell 28 to implement the six product-term function of equation 1 with only two product-terms. However, use of the shared expander introduces a shared expander delay resulting from the word line loading inherent in making another pass through array 36.

Figure 4:
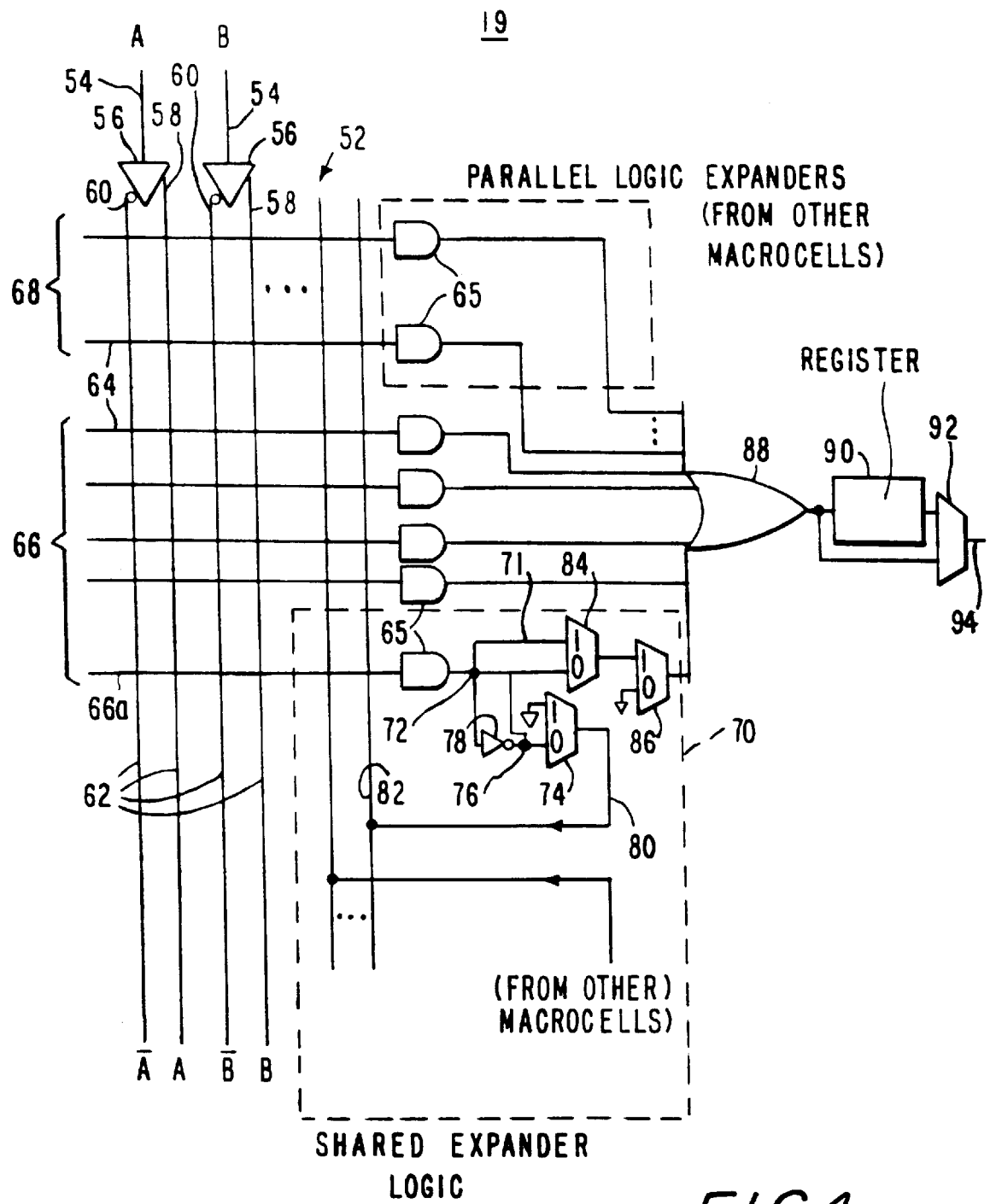
FIG. 4 is a diagram of an illustrative macrocell having selectable inversion circuitry in accordance with the present invention.

With the macrocell arrangement of the present invention, the product-term that feeds the shared expander region of the macrocell may be inverted without being fed back to the input of the macrocell as with the conventional arrangement of FIG. 3. This is shown in FIG. 4. Input signals to logic array block 12 (FIG. 2) are provided to logic array block programmable interconnect array 52 via inputs 54 and drivers 56. Logic array block programmable interconnect array 52 is interconnected to programmable interconnect array 14 of FIG. 1 and spans macrocell 19 and each of the other macrocells in the logic array block associated with macrocell 19. Drivers 56 provide non-inverted versions of the input signals at non-inverting outputs 58. Inverted versions of the logic signals provided to inputs 54 are provided by drivers 56 at inverting outputs 60. Array 52 contains programmable connections at the intersections of bits lines 62 and word lines 64 that allow a logic designer to selectively implement various logic AND functions, as indicated by AND gate schematic symbols 65. For example, array 52 may be configured so that one word line 64 passes the logic signal A, another word line passes the logic signal A·B, and yet another word line passes the logic signal C·D. Only the logic signals A and B and their complements are shown as labeled inputs in FIG. 4 to avoid over-complicating the drawing, but it will be appreciated that other input signals are labeled in a similar fashion to inputs A and B. Any suitable number of inputs may be associated with a given logic array block. For example, there may be 36 inputs each of which may be passed to array 52 in both a non-inverted and an inverted version by drivers 56.

Five of the word line inputs received by macrocell 19 are normal product-terms 66. Five is merely an illustrative number. Any suitable number of product-terms may be associated with each macrocell. Macrocell 19 may also have any suitable number of associated parallel expanders 68. For example, 15 parallel expanders 68 may be associated with macrocell 19. Parallel expanders 68 are product-terms that have been borrowed from other macrocells 19 in logic array block 12 (FIG. 2).

Shared expander logic 70 may be used to feed back an inverted version of product-term 66a to array 52. Product-term 66a is initially received as an input to macrocell 19 at node 72. A non-inverted version of the product-term signal is provided on line 71. Inverter 78 is used to invert the signal on node 72 to produce an inverted version of the product-term signal at node 76. If it is desired to feed back the inverted version of product-term 66a, multiplexer 74 may be configured to connect its "0" input to its output so that the inverted version of product-term 66a may be passed to array 52 via lines 80 and 82. Multiplexer 84 may be configured to pass either the non-inverted product-term signal on line 71 or the inverted product-term signal at node 76 to its output. The state of multiplexer 84 may be determined by the need to invert the product-term signal at node 72 to perform a DeMorgan's transformation and thereby reduce the total number of product-terms used in implementing a desired logic function. The output of multiplexer 84 is connected to the "1" input of multiplexer 86.

Multiplexer 86 is configured to pass its "1" input to its output when it is desired to have the product-term input from node 72 (in its inverted or non-inverted version) passed to OR logic 88. The output of OR logic 88 may be connected to register 90. Multiplexer 92 may be configured to provide either the registered version of the output of OR logic 88 from register 90 or the unregistered version of the output of OR logic 88 to output 94. When multiplexer 86 is configured to pass its "0" input to its output, a ground signal is applied to OR logic 88. When multiplexer 74 is configured to pass its "0" input to its output, a ground signal is applied to line 80.

With the arrangement of FIG. 4, the logic function of Equation 1 may be implemented as shown in Equation 3.

$$A \cdot B + (\overline{C} \cdot \overline{D} \cdot \overline{E} \cdot \overline{F} \cdot \overline{G} + ee) \qquad (3)$$

Equation 3 demonstrates how the logic function of Equation 1, which used six product-terms, could be reduced to a logic function involving only two product-terms. Moreover, Equation 3 demonstrates how this may be accomplished using inverter 78 in the arrangement of FIG. 4, without introducing a shared expander delay as was the case when the Equation 1 function was implemented using the arrangement of FIG. 3 (as shown by Equation 2).

If desired, the arrangement of FIG. 4 may be used to support a shared expander feature in which the signal at node 72 is inverted by inverter 78 and passed to the input of macrocell 19 by multiplexer 74 (which is configured to pass its "0" input to its output) and lines 80 and 82.

The functionality of the circuit arrangement of FIG. 4 has been described using multiplexers. This is merely illustrative. The switching functions of the FIG. 4 multiplexers may be implemented using any suitable switchable circuitry. This circuitry may be configured to perform its desired functions using any suitable programmable logic device programming technique.

In addition, not every detail of a typical macrocell has been depicted in FIG. 4, because such details are well known and may vary depending on the needs of the programmable logic device of which macrocells 19 are a part. Circuit elements not shown in FIG. 4 may be added to or interposed between the various circuit elements of FIG. 4 to perform additional functions if desired.

The logic array block programmable interconnect array associated with each logic array block has been described as performing AND logic. Such AND logic may be logic for performing logical AND functions or logical NAND functions. Similarly, the OR logic in each macrocell may be logic for performing logical OR functions or logical NOR functions. If desired, other equivalent logic structures may be used to produce product terms and to combine the product terms in the macrocells.

Figure 5:
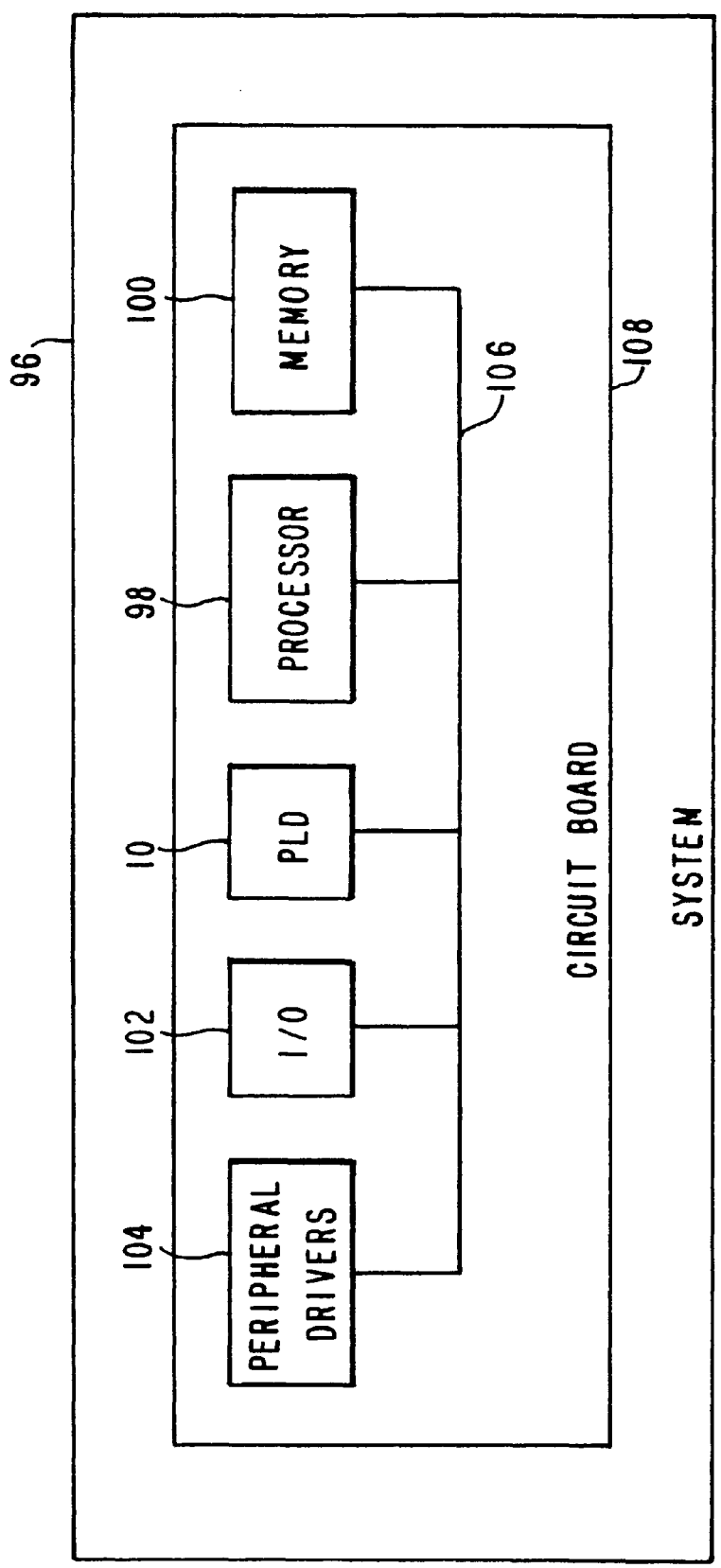
FIG. 5 is a diagram of an illustrative system in which the programmable logic device arrangements of the present invention may be used.

The foregoing arrangements are typically used in programmable logic devices that are made part of larger systems. FIG. 5 shows a programmable logic device 10 containing circuitry such as the selective inversion macrocell circuitry of the present invention in use in a data processing system 96. Data processing system 96 may include one or more of the following components: a processor 98, memory 100, I/O circuitry 102, and peripheral drivers 104. These components are coupled together by a system bus 106 and populate a circuit board 108 that is contained in system 96.

System 96 may be used in a wide variety of applications, such as computer networking, data networking, instrumentation, video processing, digital signal processing, or any other application where the advantage of using programmable logic is desirable. Programmable logic device 10 may be used to perform a variety of different logic functions. For example, programmable logic device 10 may be configured as a processor or controller that works in cooperation with processor 98. Programmable logic device 10 may also be used as an arbiter for arbitrating access to a shared resource in system 96. In yet another example, programmable logic device 10 may be configured as an interface between processor 98 and one of the other components in system 96.

The programmable connections made between various components and used in configuring the programmable logic circuits in the programmable logic devices of the present invention can be implemented in any of a wide variety of ways. For example, each programmable connection can be a relatively simple programmable connector such as a switch or a plurality of switches for connecting any one of several inputs to an output. Each such connection may be configured using a memory cell such as a random-access memory cell. Alternatively, programmable connectors can be somewhat more complex elements which are capable of performing logic (e.g., by logically combining several of their inputs) as well as making connections. For example, each programmable connection can use product-term logic, implementing functions such as AND, NAND, OR, or NOR. Examples of components suitable for implementing programmable connections are erasable programmable read-only memories (EPROMs), electrically-erasable programmable read-only memories (EEPROMs), pass transistors, transmission gates, antifuses, laser fuses, metal optional links, etc. These programmable components may be controlled by various programmable function control elements or memory cells, which store the configuration data used to control the programmable components. Examples of suitable function control elements include static random-access memory (SRAM) cells, dynamic random-access memory (DRAM) cells, first-in first-out cells, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

The foregoing is merely illustrative of the principles of this invention and various modifications can be made by those skilled in the art without departing from the scope and spirit of the invention.

What is claimed is:

1. Programmable logic device macrocell circuitry with selectable product-term inversion, comprising:

a macrocell that receives a number of normal product-terms as inputs and that has an associated output;

OR logic in the macrocell interposed between the inputs and the outputs;

shared expander logic associated with the macrocell for feeding back a product-term signal associated with a given one of the normal product-terms to the inputs of the macrocell;

an inverter in the shared expander logic connected to the given product-term for inverting the given product-term to produce an inverted version of the given product-term; and switching circuitry in the macrocell that is configured to selectively pass the inverted version of the given product-term to the OR logic.

2. The programmable logic device macrocell circuitry defined in claim 1 wherein the switching circuitry comprises a first multiplexer having a first input that receives the given product-term, a second input that receives the inverted version of the given product-term, and an output for providing a selected one of: (a) the given product-term received at the first input and (b) the inverted version of the given product-term received at the second input.

3. The programmable logic device macrocell circuitry defined in claim 2 further comprising circuitry for connecting the output of the first multiplexer to the OR logic.

4. The programmable logic device macrocell circuitry defined in claim 3 wherein the circuitry for connecting the output of the first multiplexer to the OR logic further comprises a second multiplexer interposed between the first multiplexer and the OR logic, wherein the second multiplexer selectively passes the output of the first multiplexer or a first fixed potential to the OR logic.

5. The programmable logic device macrocell circuitry defined in claim 4 further comprising register logic for receiving signals from the OR logic.

6. The programmable logic device macrocell circuitry defined in claim 4 further comprising a third multiplexer interposed between the inverter and the inputs of the macrocell for passing to the inputs of the macrocell a selected one of: (a) the inverted version of the given product-term and (b) a second fixed potential.

7. The programmable logic device macrocell circuitry defined in claim 6 where in the first potential equals the second potential.

8. The programmable logic device macrocell circuitry defined in claim 1 wherein the product-term signal that is fed back to the macrocell as one of the normal product-term inputs is an inverted version of the given product-term.

9. The programmable logic device macrocell circuitry defined in claim 1 further comprising at least one shared expander line over which the product-term signal that is fed back to the macrocell is provided to the normal product-term inputs of the macrocell.

10. The programmable logic device macrocell circuitry defined in claim 1 further comprising a programmable interconnect array that receives a plurality of logic input signals, that performs a logical AND function on at least some of those signals, and that passes resulting product-terms to the macrocell as the normal product-term inputs.

11. A programmable logic device comprising:
a plurality of logic array blocks;
a programmable interconnect array that interconnects the logic array blocks;
a plurality of macrocells in each logic array block, each macrocell receiving a number of normal product-terms as inputs and having an associated output;
OR logic in the macrocell interposed between the inputs and the output;
shared expander logic associated with each macrocell for feeding back a product-term signal associated with a given one of the normal product-terms to the inputs of that macrocell;
an inverter in the shared expander logic of each macrocell connected to the given product-term for inverting the given product-term to produce an inverted version of the given product-term; and
switching circuitry in each macrocell that is configured to selectively pass the inverted version of the given product-term to the OR logic.

12. The programmable logic device defined in claim 11 wherein the switching circuitry in each macrocell comprises a first multiplexer having a first input that receives the given product-term, a second input that receives the inverted version of the given product-term, and an output for providing a selected one of: (a) the given product-term received at the first input and (b) the inverted version of the given product-term received at the second input.

13. The programmable logic device defined in claim 12 further comprising circuitry in each macrocell for connecting the output of the first multiplexer to the OR logic of that macrocell.

14. The programmable logic device defined in claim 13 wherein the circuitry in each macrocell for connecting the output of the first multiplexer to the OR logic of that macrocell further comprises a second multiplexer in each macrocell interposed between the first multiplexer and the OR logic, wherein the second multiplexer selectively passes the output of the first multiplexer or a first fixed potential to the OR logic.

15. The programmable logic device defined in claim 14 further comprising register logic in each macrocell for receiving signals from the OR logic.

16. The programmable logic device defined in claim 14 further comprising a third multiplexer in each macrocell interposed between the inverter and the inputs of that macrocell for passing to the inputs of that macrocell a selected one of: (a) the inverted version of the given product-term and (b) a second fixed potential.

17. The programmable logic device defined in claim 16 wherein the first potential equals the second potential.

18. The programmable logic device defined in claim 11 wherein the product-term signal that is fed back to each macrocell as one of the inputs is an inverted version of the given product-term.

19. The programmable logic device defined in claim 11 further comprising at least one shared expander line in each macrocell over which the product-product-term signal that is fed back to that macrocell is provided to the inputs of that macrocell.

20. The programmable logic device defined in claim 11 further comprising a logic array block programmable interconnect array associated with the macrocells in each logic array block that receives a plurality of logic input signals, that performs a logical AND function on at least some of those signals, and that passes resulting product-terms to each macrocell in that logic array block as the normal product-term inputs.

21. A digital processing system comprising:
a processor;
a memory coupled to the processor; and
a programmable logic device coupled to the processor and the memory, the programmable logic device having:
a plurality of logic array blocks;
a programmable interconnect array that interconnects the logic array blocks;
a plurality of macrocells in each logic array block, each macrocell receiving a number of normal product-terms as inputs and having an associated output;
OR logic in each macrocell interposed between the inputs and the output of that macrocell;
shared expander logic associated with each macrocell for feeding back a product-term signal associated with a given one of the normal product-terms to the inputs of that macrocell;
an inverter in the shared expander logic of each macrocell connected to the given product-term for inverting the given product-term to produce an inverted version of the given product-term; and switching circuitry in each macrocell that is configured to selectively pass the inverted version of the given product-term to the OR logic.

22. The digital processing system defined in claim 21 further comprising a circuit board on which the memory, the processor, and the programmable logic device are mounted.

23. The digital processing system defined in claim 21 further comprising input/output circuitry coupled to the programmable logic device, the processor, and the memory.

24. The digital processing system defined in claim 21 further comprising peripheral drivers coupled to the programmable logic device, the processor, and the memory.

* * * * *